(12) United States Patent
Nadeau et al.

(10) Patent No.: US 10,608,404 B2
(45) Date of Patent: Mar. 31, 2020

(54) BONDED LASER WITH SOLDER-FREE LASER ACTIVE STRIPE IN FACING RELATIONSHIP WITH SUBMOUNT

(71) Applicant: Cisco Technology, Inc., San Jose, CA (US)

(72) Inventors: Mary Nadeau, Alburtis, PA (US); Jarrett S. Neiman, Coopersburg, PA (US); Mittu Pannala, Breinigsville, PA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 15/431,840

(22) Filed: Feb. 14, 2017

(65) Prior Publication Data

US 2018/0233880 A1 Aug. 16, 2018

(51) Int. Cl.
*H01S 5/022* (2006.01)
*H01S 5/22* (2006.01)
*H01S 5/042* (2006.01)

(52) U.S. Cl.
CPC ........ *H01S 5/02236* (2013.01); *H01S 5/0224* (2013.01); *H01S 5/02248* (2013.01); *H01S 5/02252* (2013.01); *H01S 5/02256* (2013.01); *H01S 5/02276* (2013.01); *H01S 5/0425* (2013.01); *H01S 5/22* (2013.01); *H01S 5/02268* (2013.01)

(58) Field of Classification Search
CPC ............. H01S 5/02236; H01S 5/02256; H01S 5/02252; H01S 5/02248; H01S 5/0421; H01S 5/22
See application file for complete search history.

(56) References Cited

U.S. PATENT DOCUMENTS

| 3,936,322 A * | 2/1976 | Blum ...................... H01L 33/00 257/611 |
| 5,977,565 A | 11/1999 | Ishikawa et al. |
| 6,456,641 B1 | 9/2002 | Hauer et al. |
| 6,786,654 B2 * | 9/2004 | Kilian .................. G02B 6/4202 385/94 |
| 2001/0024460 A1 * | 9/2001 | Yamamoto .............. H01L 24/24 372/36 |
| 2002/0018499 A1 | 2/2002 | Kuniyasu et al. |
| 2002/0110172 A1 | 8/2002 | Hasnain et al. |
| 2003/0174753 A1 | 9/2003 | Yabuki et al. |
| 2003/0199109 A1 | 10/2003 | Kuzma |
| 2004/0046221 A1 | 3/2004 | Kuzma |
| 2004/0165626 A1 | 8/2004 | Kuniyasu et al. |

(Continued)

OTHER PUBLICATIONS

PCT Written Opinon of the International Searching Authority for Application No. PCT/US2018/016455 dated Jan. 2, 2018.

*Primary Examiner* — Yuanda Zhang
(74) *Attorney, Agent, or Firm* — Patterson + Sheridan, LLP

(57) ABSTRACT

A laser light source, a submount for a semiconductor laser, and a method of providing a laser light source are provided. The laser light source includes a submount with first and second electrical contacts thereon and a trench there-between. A semiconductor laser is bonded to the submount by bonding third and fourth electrical contacts of the laser to the first and second electrical contacts, respectively. The third and fourth electrical contacts of the laser are arranged on opposite side of a laser active stripe, which is arranged over the trench of the submount.

13 Claims, 10 Drawing Sheets

(56) References Cited

U.S. PATENT DOCUMENTS

| | | | |
|---|---|---|---|
| 2006/0171435 A1 | 8/2006 | Ohshima et al. | |
| 2006/0251137 A1* | 11/2006 | Sung | H01S 5/22 372/46.01 |
| 2007/0096130 A1* | 5/2007 | Schiaffino | H01L 33/0079 257/98 |
| 2007/0116069 A1 | 5/2007 | Wang et al. | |
| 2011/0013655 A1* | 1/2011 | Takase | G11B 7/1275 372/45.01 |
| 2014/0348196 A1* | 11/2014 | Yoshinaga | H01S 5/3401 372/45.01 |
| 2015/0023376 A1* | 1/2015 | Yamanaka | H01S 5/02256 372/36 |
| 2016/0266322 A1 | 9/2016 | Epitaux et al. | |

* cited by examiner

US 10,608,404 B2

BONDED LASER WITH SOLDER-FREE LASER ACTIVE STRIPE IN FACING RELATIONSHIP WITH SUBMOUNT

TECHNICAL FIELD

Embodiments presented in this disclosure generally relate to semiconductor lasers. More specifically, embodiments disclosed herein include submounts for a semiconductor laser that allow the semiconductor laser to be bonded to the submount with a laser active strip mounted in a facing relationship with the submount and without solder contacting the laser active stripe.

BACKGROUND

Optical transceivers and other optical circuits typically include a semiconductor laser light source that is bonded to a submount with solder. Control of dimensional tolerances, thermal management, and minimal or no bonding-induced damage to an active laser stripe of the semiconductor laser are necessary to achieve acceptable laser performance and optical coupling on such optical circuits. Most semiconductor lasers are bonded with the laser active stripe facing away from the submount to avoid introducing mechanical and/or thermal stresses into the laser active stripe, which may be caused by direct contact of the laser active stripe with the solder and submount. However, such a configuration generally results in larger dimensional tolerances, which can impair optical coupling of the optical circuit.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 10 is a top perspective view of the submount of FIG. 1A with an optical element arranged in a cavity of a substrate of the submount.

To facilitate understanding, identical reference numerals have been used, where possible, to designate identical elements that are common to the figures. It is contemplated that elements disclosed in one embodiment may be beneficially utilized on other embodiments without specific recitation.

DESCRIPTION OF EXAMPLE EMBODIMENTS

Overview

Figure 1A:
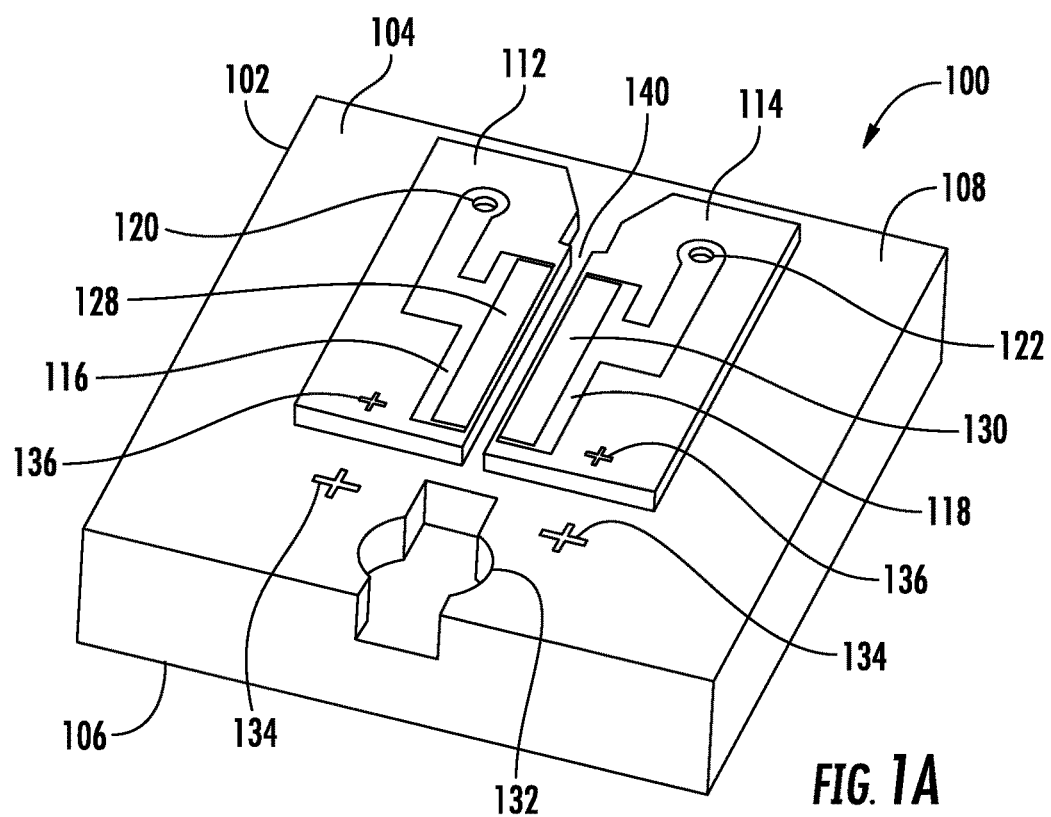
FIG. 1A is a top perspective view of a submount according to one embodiment.

In one embodiment presented in this disclosure, a laser light source comprises a submount. The submount comprises a substrate that includes a first side and an opposing second side. The submount also includes a first electrical contact and a second electrical contact arranged on the first side. The first electrical contact and the second electrical contact are separated by a trench. The laser light source also includes a semiconductor laser comprising a third electrical contact and a fourth electrical contact. The semiconductor laser includes a laser active stripe arranged between the third and fourth electrical contacts. The third electrical contact is connected to one of an n-doped side or a p-doped side in the semiconductor laser. The first electrical contact of the submount is bonded to the third electrical contact of the semiconductor laser and the second electrical contact of the submount is bonded to the fourth electrical contact of the semiconductor laser. The laser active stripe is arranged between the third and fourth electrical contact and over the trench.

In another embodiment presented in this disclosure, a submount for a solid-state laser comprises a substrate that includes a first side and an opposing second side. The submount also includes a first electrical contact and a second electrical contact arranged on the first side. The first electrical contact and the second electrical contact are separated by a trench that is etched into the substrate. The first and second electrical contacts are arranged to bond with respective electrical contacts of a semiconductor laser placed on the first side of the substrate. The submount is configured to provide an electrical bias across the first and second electrical contacts to power a laser.

In another embodiment presented in this disclosure, a method comprises providing a submount. The submount comprises a substrate that includes a first side and an opposing second side. The submount also comprises a first electrical contact and a second electrical contact arranged on the first side. The first electrical contact and the second electrical contact are separated by a trench. The method also comprises providing a semiconductor laser. The semiconductor laser comprises a third electrical contact and a fourth electrical contact. The semiconductor laser includes a laser active stripe arranged between the third and fourth electrical contacts. The third electrical contact is connected to a p-doped side. The fourth electrical contact is connected to an n-doped side. The method also comprises arranging the semiconductor laser over the first side of the substrate of the submount such that the first electrical contact is aligned with the third electrical contact and the second electrical contact is aligned with the fourth electrical contact. The method also comprises bonding the third electrical contact to the first electrical contact. The method also comprises bonding the fourth electrical contact to the second electrical contact.

EXAMPLE EMBODIMENTS

In embodiments described herein, a semiconductor laser that includes a laser active stripe is bonded to a submount with the laser active stripe arranged in a facing relationship with the submount. The submount includes first and second electrical contacts with a trench there-between. The semiconductor laser includes third and fourth electrical contacts arranged on opposing sides of the laser active stripe. The third and fourth electrical contacts of the semiconductor laser are bonded to the first and second electrical contact of the submount such that the laser active stripe is arranged over the trench. The trench prevents or reduces the possibility that solder or conductive epoxy bonding the electrical contacts will contact the laser active stripe. Such contact, as well as thermal expansion mismatches between such contacting parts, may result in mechanical stresses on the laser active stripe. The trench also prevents or reduces the possibility of solder or epoxy from forming a conductive bridge between the n-doped side and the p-doped contacts, which could cause an electrical short.

Figure 1B:
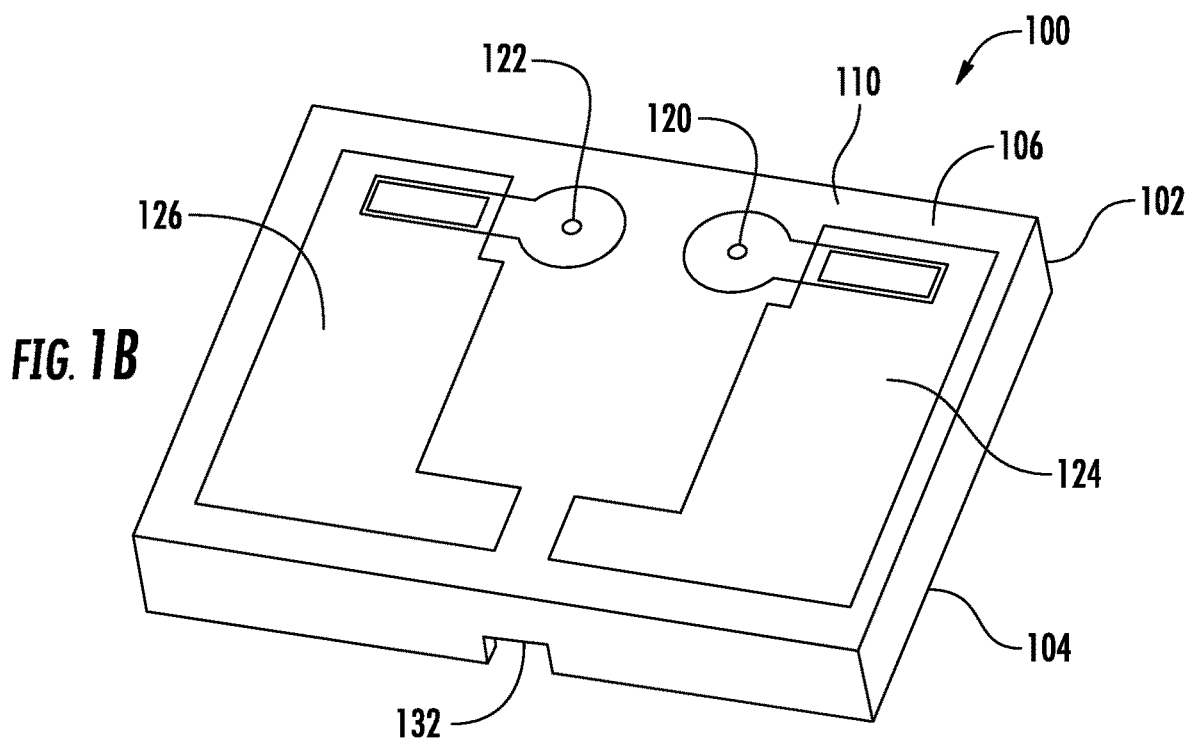
FIG. 1B is a bottom perspective view of the submount of FIG. 1A.
Figure 1C:
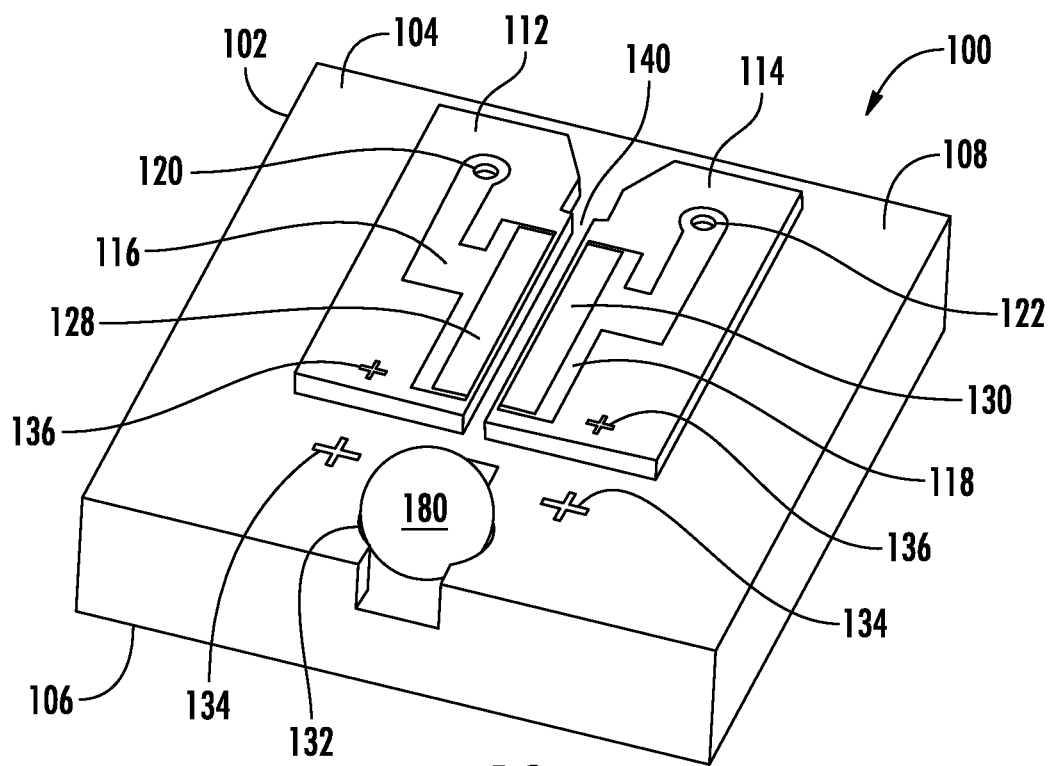
FIG. 1D is a top perspective view of a submount according to another embodiment.

FIGS. 1A and 1B are top and bottom perspective views, respectively, of a submount 100 that can be electrically connected to a semiconductor laser. The submount 100 includes a substrate 102 that includes a first side 104 and an opposing second side 106. The first side 104 of the substrate 102 includes a first electrical contact 116 and a second electrical contact 118 arranged thereon. The first electrical contact 116 and the second electrical contact 118 can be bonded to respective electrical contacts of a semiconductor laser. For example, in one embodiment, the first electrical contact 116 of the submount 100 is bonded to a p-doped electrical contact of a semiconductor laser and the second electrical contact 118 of the submount is bonded to an n-doped electrical contact of the semiconductor laser. In another embodiment, the first electrical contact 116 of the submount 100 is bonded to an n-doped electrical contact of the semiconductor laser and the second electrical contact 118 of the submount 100 is bonded to a p-doped electrical contact of the semiconductor laser. To facilitate bonding, the first electrical contact 116 includes a first solder stripe 128 and the second electrical contact 118 includes a second solder stripe 130. The solder stripes 128 and 130 can be pre-deposited on the respective electrical contacts 116 and 118 or could be introduced as a preform during assembly. In an alternative embodiment, a conductive epoxy is used in place of the solder stripes 128 and 130. In yet another alternative embodiment, a metal-to-metal bond is used in place of the solder stripes.

In the embodiment shown in FIGS. 1A and 1B, the first electrical contact 116 and the second electrical contact 118 are arranged on raised surfaces 112 and 114, respectively, that protrude above the remainder of the surface 108 of the first side 104. In one embodiment, the substrate 102 may start with a uniform surface that is level with the surfaces 112 and 114. Thereafter, the first side 104 of the substrate 102 may be, for example, etched or machined to remove material from the substrate 102 to form the raised surfaces 112 and 114 and the surface 108. The raised surfaces 112 and 114 form a trench 140 that is between the first electrical contact 116 and the second electrical contact 118. As will be discussed in greater detail below, electrical contacts of the semiconductor laser are arranged such that the laser active stripe of the semiconductor laser is arranged over the trench 140 when the electrical contacts of the semiconductor laser are bonded to the first and second electrical contacts 116 and 118 of the submount 100.

The second side 106 of the substrate 102 includes a first power contact 124 and a second power contact 126 arranged on a surface 110 of the second side 106. The first and second power contacts 124 and 126 are electrically connected to a circuit to provide power for a semiconductor laser mounted to the first electrical contact 116 and the second electrical contact 118 on the first side 104 of the substrate 102. Electrical power is transmitted from the first and second power contacts 124 and 126 to the respective first and second electrical contacts 116 and 118 through electrical vias (known as "TSV" for a silicon substrate) 120 and 122, respectively.

In the embodiment shown in FIGS. 1A and 1B, the substrate 102 includes a cavity 132 on the first side of the substrate 102 configured to receive an optical component, such as a ball lens or other optical component that operates on laser light emitted by the semiconductor laser. The cavity 132 can be etched or machined, for example, into the substrate 102. The cavity 132 can include a shape that allows the optical component placed therein to self-locate. In various aspects, the shape of the cavity 132 can facilitate passive alignment or active alignment of the optical component with the semiconductor laser. FIG. 10 illustrates an optical element 180 arranged in the cavity 132.

Figure 1D:
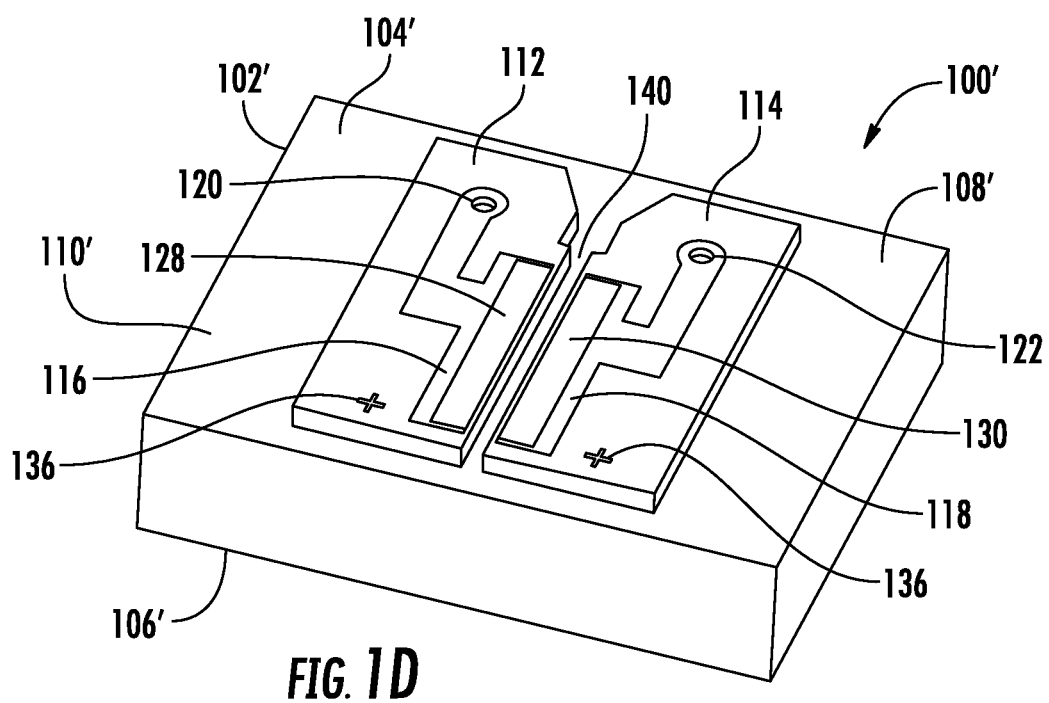

In various embodiments, the submount may omit the cavity 132 for an optical component. For example, FIG. 1D illustrates an embodiment of the submount 100' in which the surface 110' of the first side 104' of the substrate 102' does not include a cavity 132 for an optical component.

In various embodiments, the substrate 102 can include one or more fiducials that enable a machine vision system to identify the substrate 102 and its position and orientation for assembly. FIGS. 1A, 10, and 1D illustrate one set of fiducials 136 arranged on the raised surfaces 112 and 114 of the substrate 102. FIGS. 1A and 10 illustrate another set of fiducials 134 arranged on the surface 108 on the first side 104 of the substrate 102. The fiducials 134 and 136 are illustrated as cross shapes, although other suitable shapes may be used instead. The fiducials 134 and 136 can be etched into the surfaces 108, 112, and 114 of the substrate 102 or be formed as part of the metal pattern. Thereafter, a digital camera in communication with assembly machinery can use the fiducials 134 and 136 to locate the substrate 102 and to orient the substrate 102 with respect to the assembly machinery and/or with respect to other circuit components, such as a semiconductor laser to be bonded to the submount 100.

Figure 2A:
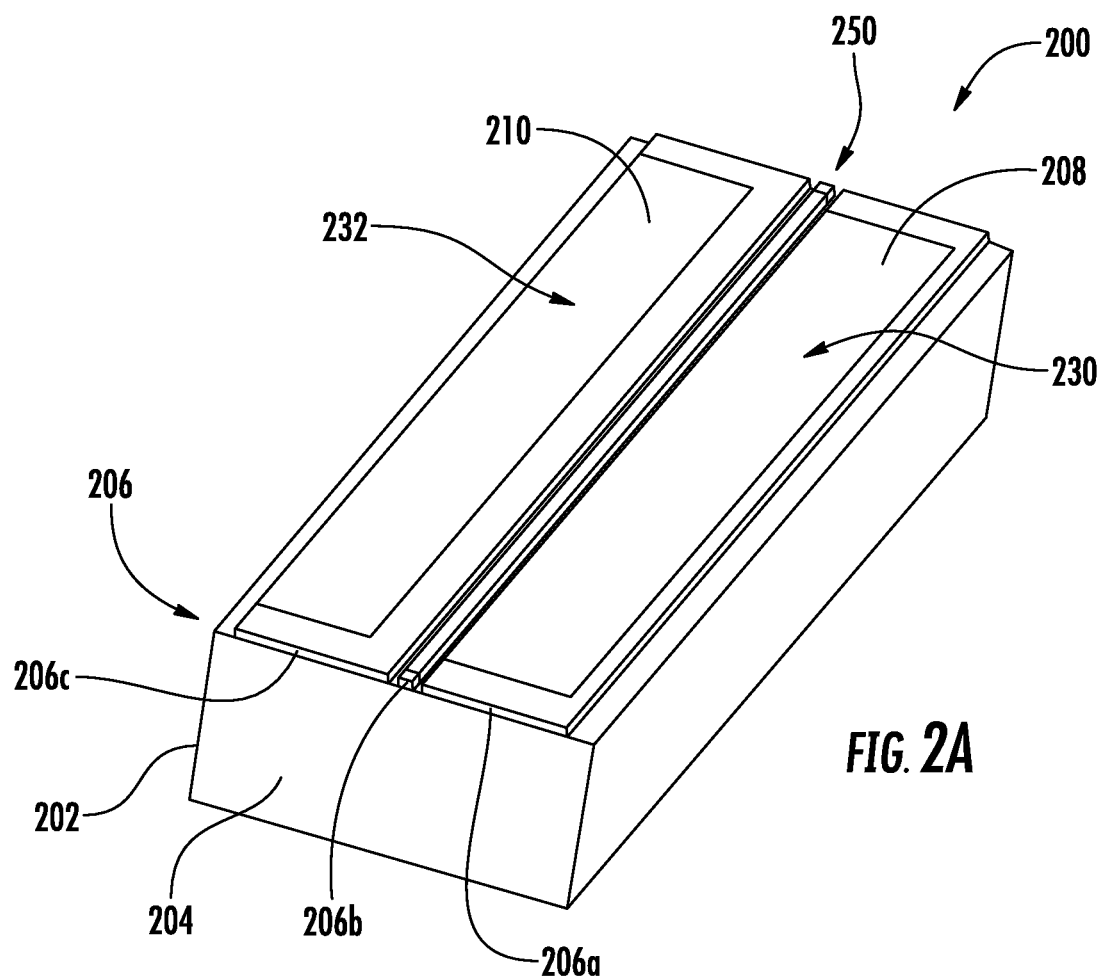
FIG. 2A is a bottom perspective view of a semiconductor laser according to one embodiment.
Figure 2B:
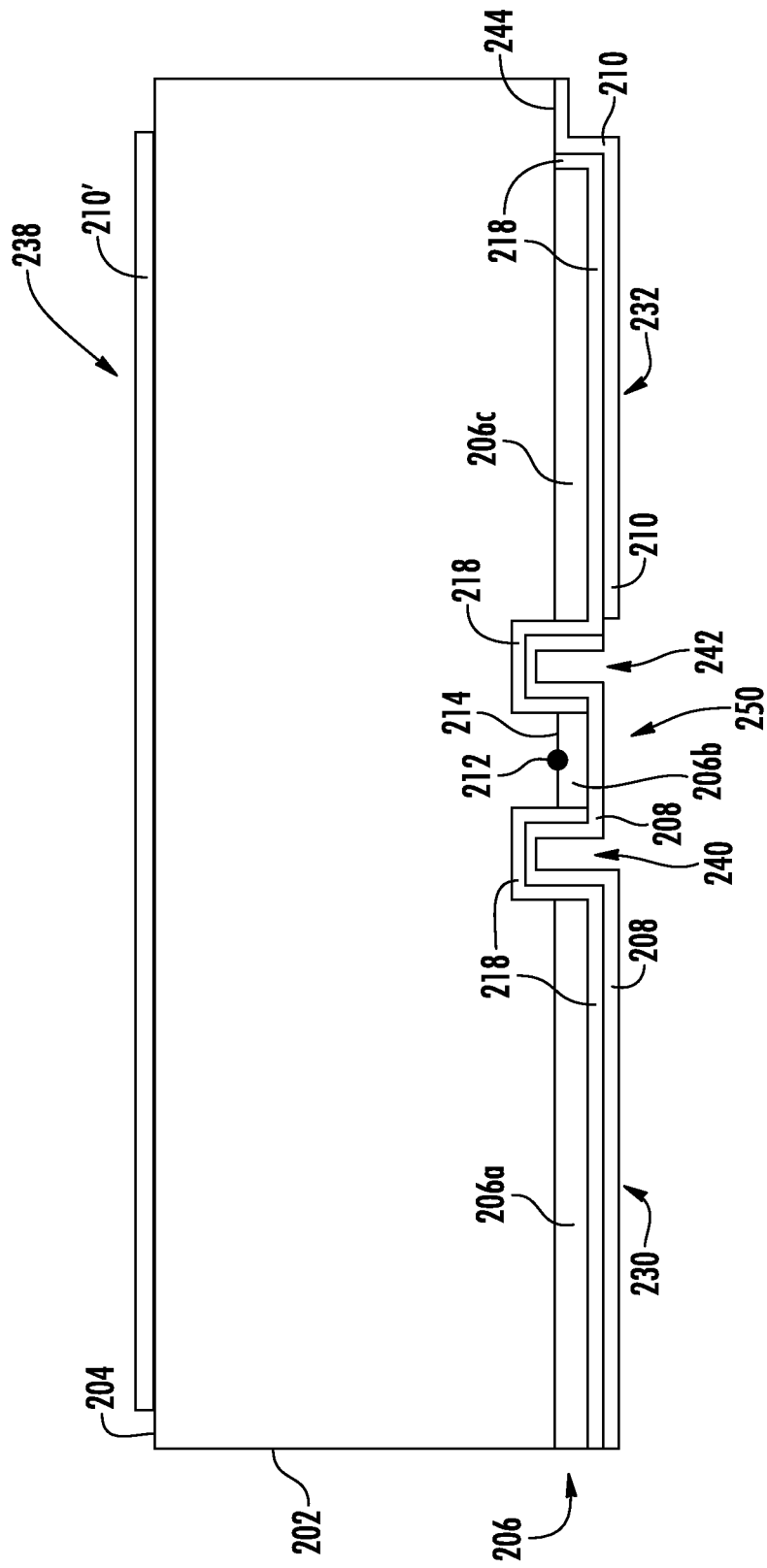
FIG. 2B is a side cross-sectional view of the semiconductor laser of FIG. 2A.

FIGS. 2A and 2B are a bottom perspective view and a cross-sectional side view, respectively, of a semiconductor laser 200 according to one embodiment. The semiconductor laser 200 includes a body 202 that has an n-doped side 204 and a p-doped side 206. The p-doped side 206 includes a plurality of p-doped regions 206a, 206b, and 206c, which are separated from one another by gaps 240 and 242, shown in FIG. 2B. The second p-doped region 206b and the p-n junction 214 between the second p-doped region 206b and the n-doped side 204 define the laser active stripe 250. A voltage generated across the p-n junction 214 of the laser active stripe 250 activates the laser (indicated in FIG. 2B as a dot 212 such that the laser beam travels out of the page). The generated voltage could be a constant voltage or a pulsed voltage.

The semiconductor laser 200 includes electrical contacts that are electrically connected to the p-doped side 206 and the n-doped side 204, respectively. Specifically, the semiconductor laser 200 includes a third electrical contact 208 (wherein the first electrical contact 116 and the second electrical contact 118 are arranged on the submount 100 shown in FIG. 1A) that is arranged over an outward-facing surface 230 of the first p-doped region, the gap 240, and the second p-doped region 206b. Optionally, the third electrical contact may also be arranged relative to the third p-doped region 206c. The third electrical contact 208 is electrically insulated from the first p-doped region 206a and the third p-doped region 206c by an insulation layer 218 (e.g., a dielectric material) such that the third electrical contact 208 is only electrically connected to the second p-doped region 206b. As shown in FIG. 2B, the insulation layer 218 covers the first p-doped region 206a, the first gap 240, the second gap 242, and the third p-doped region 206c such that the third electrical contact 208 does not electrically connect with the first and third p-doped regions 206a and 206c, respectively, or with the n-doped material in the gaps 240 and 242.

The semiconductor laser 200 includes a fourth electrical contact 210 that is electrically connected to the n-doped side 204. The fourth electrical contact 210 is arranged on an outward facing surface 232 of the insulation layer 218 covering the third p-doped region 206c. The insulation layer 218 electrically insulates the third p-doped region 206c from the fourth electrical contact 210. As shown in FIG. 2B, the third p-doped region 206c includes an undercut 244 along an edge of the body 202 such that the n-doped region 204 is exposed. The fourth electrical contact 210 extends to the undercut 244 to contact the n-doped region 204 in the undercut 244. As a result, the fourth electrical contact 210 is electrically connected to the n-doped region 204. The semiconductor laser 200 may optionally include a fifth electrical contact 210' on an outward-facing surface 238 of the n-doped region 204. The fifth electrical contact 210' may be provided in place of or in addition to the fourth electrical contact 210.

In the embodiment of the semiconductor laser 200 illustrated in FIGS. 2A and 2B and described above, the side of the semiconductor laser 200 designated by reference numeral 204 is described as an n-doped side and the side of the semiconductor laser 200 designated by reference numeral 206 is described as a p-doped side. In various embodiments, the substrate can be made of other materials with various fabrication techniques to structure n-doped and p-doped layers creating a p-n junction region and forming an active stripe for the generation of the laser light.

Figure 3A:
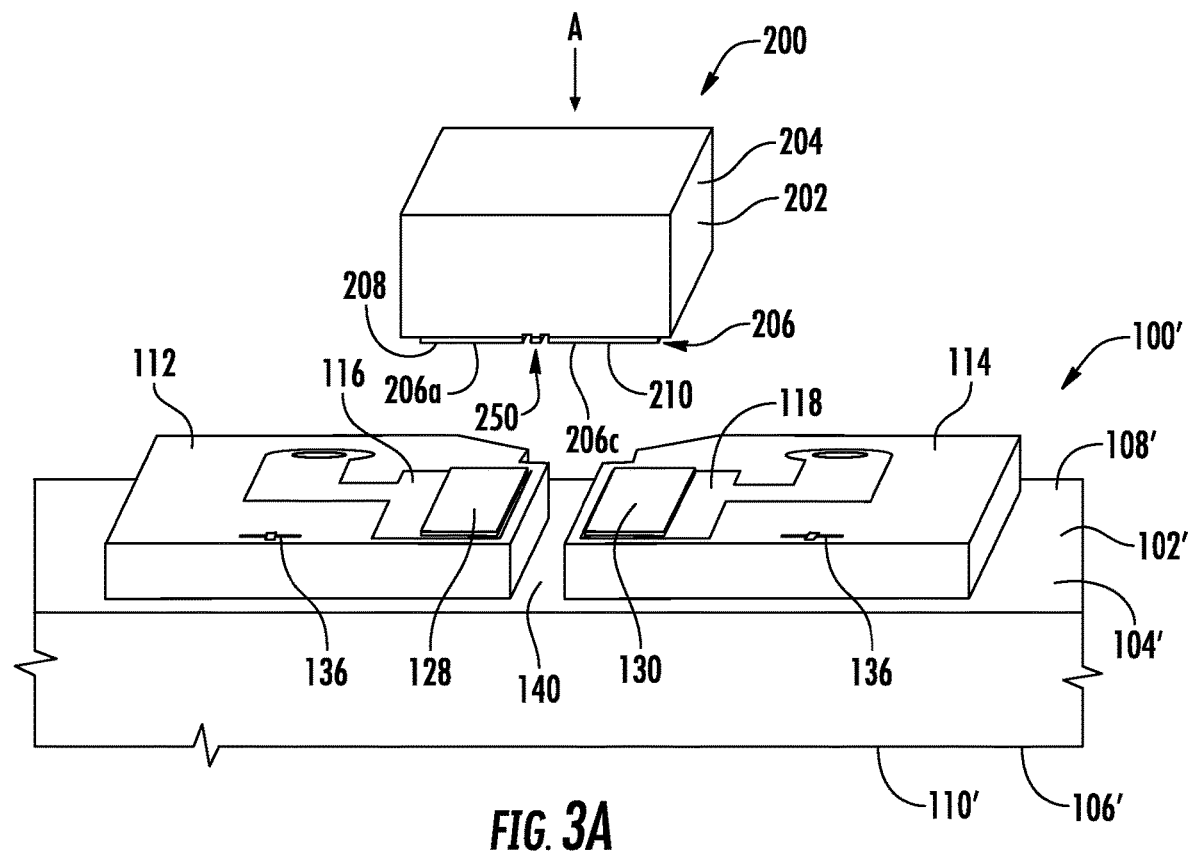
FIG. 3A is an exploded perspective view of the semiconductor laser of FIGS. 2A and 2B aligned with electrical contacts of the submount of FIG. 1D.
Figure 3B:
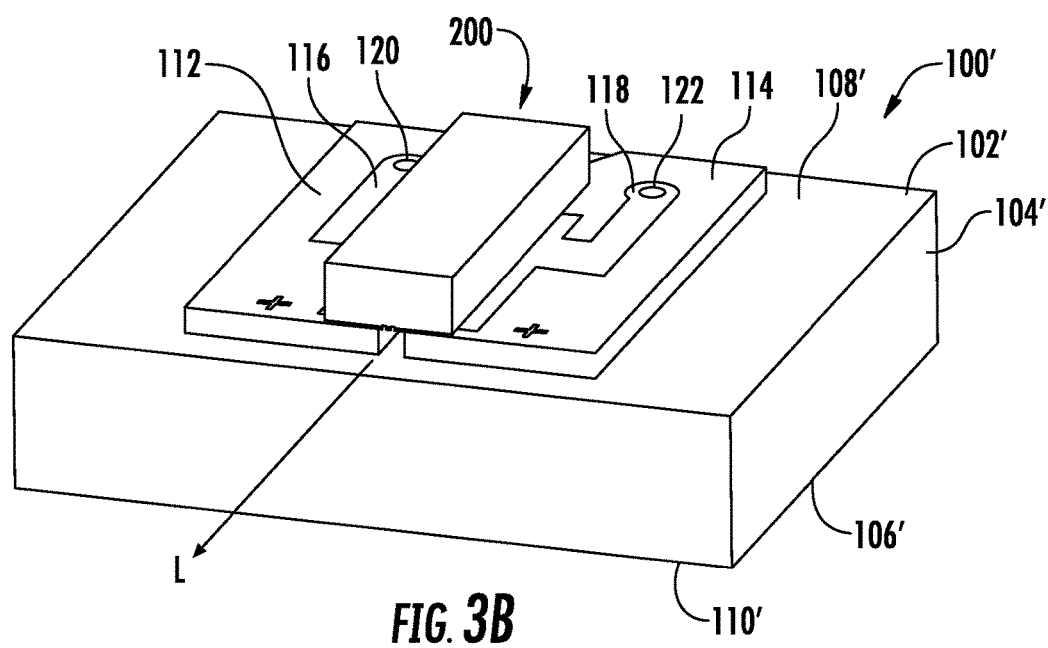
FIG. 3B is a perspective view of the semiconductor laser of FIGS. 2A and 2B bonded to the submount of FIG. 1D.
Figure 3C:
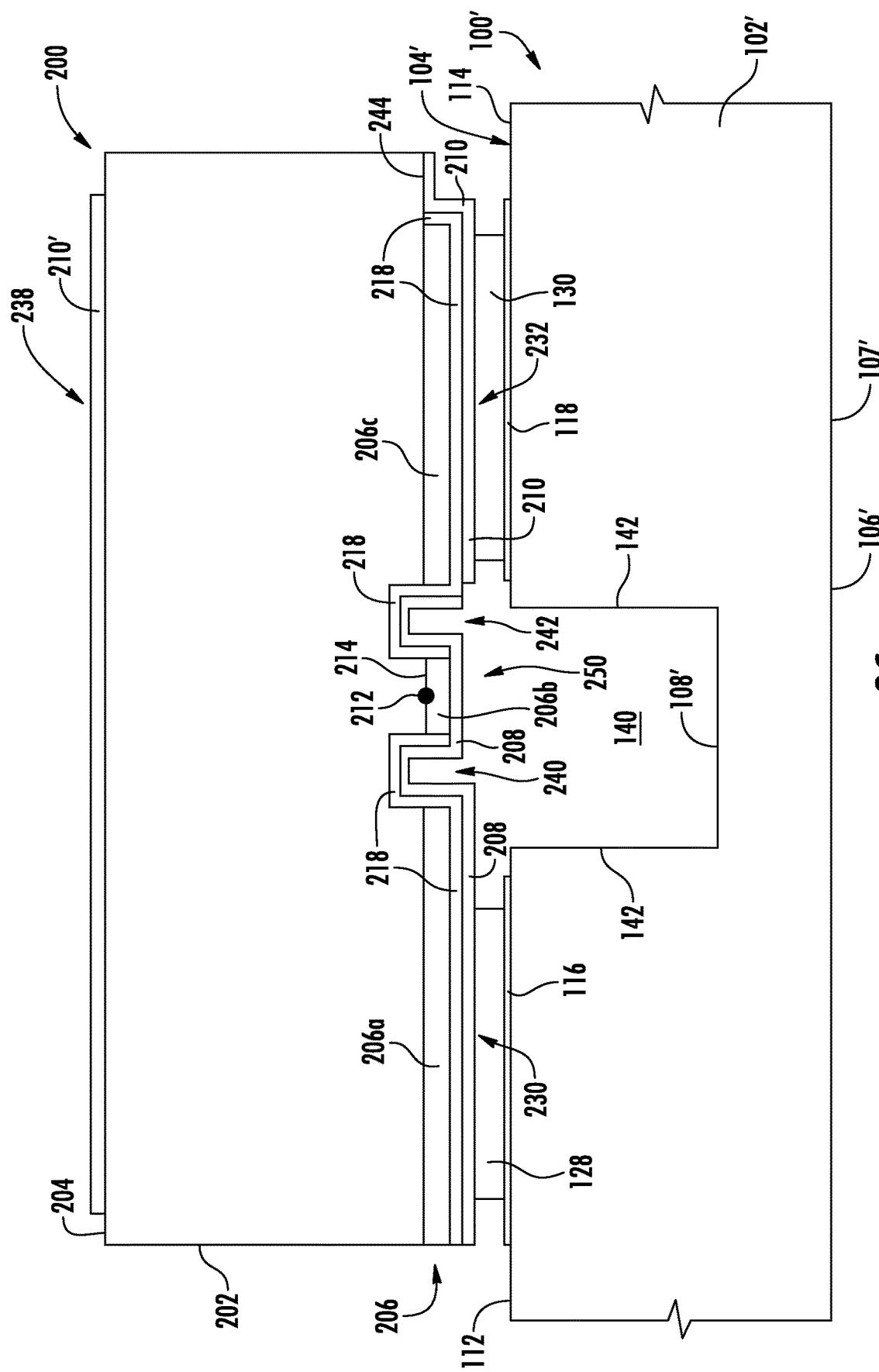
FIG. 3C is a side cross-sectional view of the semiconductor laser of FIGS. 2A and 2B bonded to the submount of FIG. 1D.

FIG. 3A illustrates the semiconductor laser 200 aligned with the submount 100' of FIG. 1D, and FIGS. 3B and 3C illustrate the semiconductor laser 200 bonded to the submount 100'. As shown in FIG. 3A, the semiconductor laser 200 is aligned with the submount 100' such that the first electrical contact 116 of the submount 100' is aligned with the third electrical contact 208 of the semiconductor laser 200 and such that the second electrical contact 118 of the submount 100' is aligned with the fourth electrical contact 210 of the semiconductor laser 200. When the semiconductor laser 200 is aligned with the submount 100', the semiconductor laser 200 is moved in the direction of arrow A to contact the submount 100'. Thereafter, the solder stripes 128 and 130 on the first and second electrical contacts 116 and 118, respectively, are melted to bond the first electrical contact 116 with the third electrical contact 208 and to bond the second electrical contact 118 with the fourth electrical contact 210. As used herein, the terms "bonding" and "bond" refer to mechanical, electrical, and/or thermal connection. Stated differently, the solder stripes 128 and 130, after melting and re-hardening, affix the semiconductor laser 200 to the submount 100' and also create respective electrical connections between the first and third electrical contacts 116 and 208 and between the second and fourth electrical contacts 118 and 210. These connections also create a thermal conduction path to dissipate the heat generated at the laser active stripe 250 while being powered.

Referring primarily to FIG. 3B, after the semiconductor laser 200 is bonded to the submount 100' and the submount 100' is electrically connected to a voltage source via the first and second power contacts 124 and 126, a voltage can be applied across the first and second electrical contacts 116 and 118. As discussed above, the voltage can be a constant voltage or a pulsed voltage. The voltage across the first and second electrical contacts 116 and 118 is transmitted to the third and fourth electrical contacts 208 and 210 and to the p-doped side 206 and an n-doped side 204 of the semiconductor laser 200. The voltage across the p-n junction 214 activates the laser active stripe 250 (indicated by the arrow L in FIG. 3B and by the dot 212 in FIG. 3C).

Referring primarily to FIG. 3C, when the semiconductor laser 200 is bonded to the submount 100', the laser active stripe 250 is arranged over the trench 140. As a result, the laser active stripe 250 is not in contact with the surface 108' of the substrate 102 or with the solder stripes 128 and 130 bonding the first and third electrical contacts 116 and 208 and the second and fourth electrical contacts 118 and 210. The absence of solder contacting the laser active stripe 250 and the clearance provided by the trench 140 could achieve acceptable thermal conduction characteristics and mechanical stress characteristics for the laser active stripe 250. As an example, the absence of solder contacting the laser active stripe 250 enables the laser active stripe 252 to expand and contract with temperature changes without induced mechanical stresses otherwise caused by solder bonded to the laser active stripe 250 having different thermal expansion properties. The improved thermal induced mechanical stress characteristics can result in improved performance of the laser active stripe 250 during operation. Furthermore, since the laser active stripe 250 is arranged on a side of the semiconductor laser 200 in a facing relationship with the submount 100', dimensional tolerances with respect to the surface 108' on the first side 104' of the substrate 102' are reduced.

Figure 4:
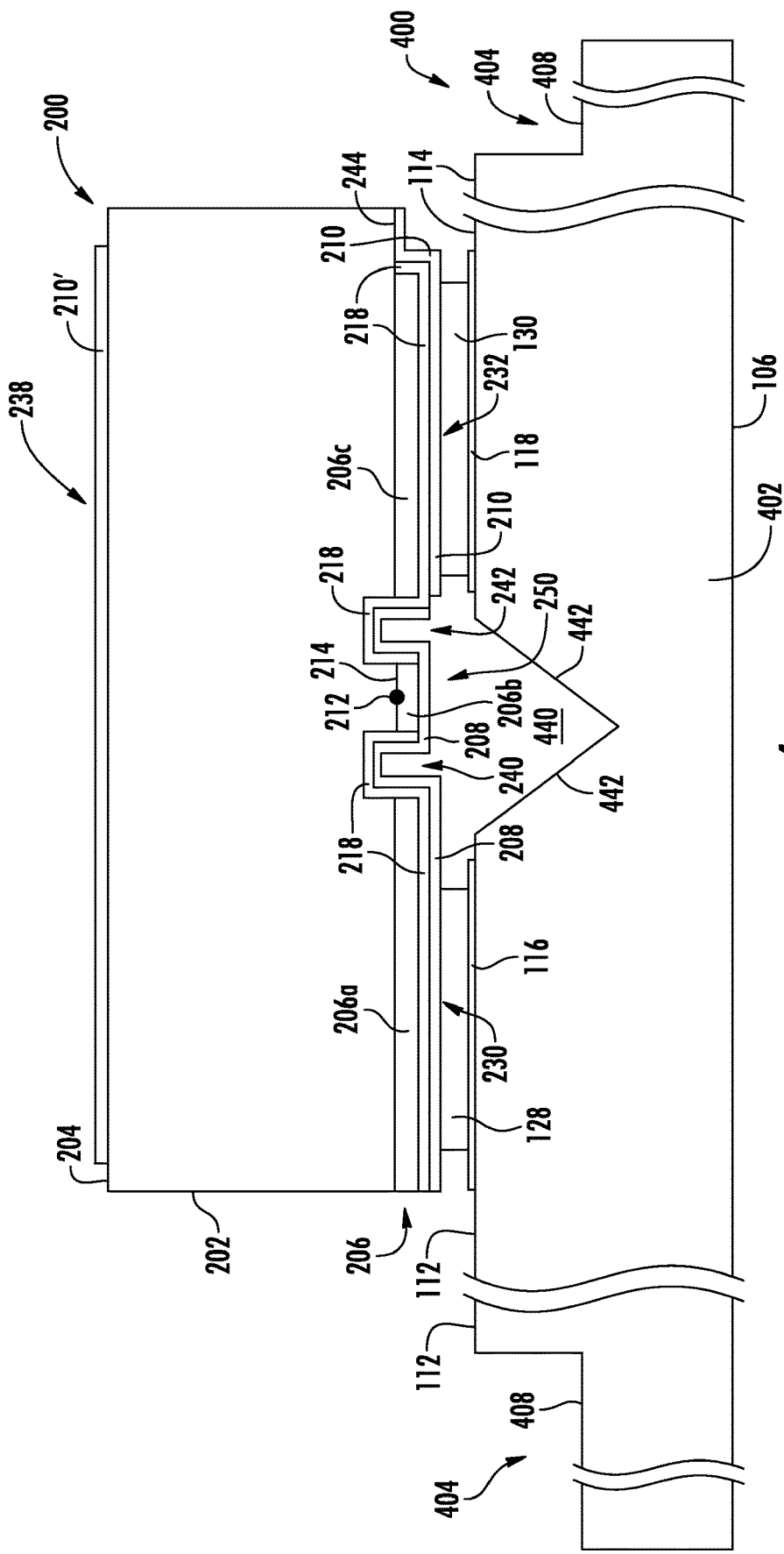
FIG. 4 is a side cross-sectional view of the semiconductor laser of FIGS. 2A and 2B bonded to a submount according to another embodiment.

The trench 140 illustrated in FIGS. 3A-3C is illustrated as having a rectangle-shaped cross-sectional profile, meaning that sidewalls 142 of the trench 140 are perpendicular to the etched surface 108' on the first side 104' of the substrate 102'. In various other embodiments, the trench 140 could have other cross-sectional profile shapes. For example, FIG. 4 illustrates a submount 400 with a substrate 402 that includes a trench 440 having a triangle-shaped cross-sectional profile, meaning that sidewalls 442 of the trench are arranged at non-orthogonal and non-parallel angles relative to an etched surface 408 of the substrate 402. Such a triangle-shaped cross-sectional profile for a trench 440 may be created using a potassium hydroxide (KOH) etching agent on a silicon crystal substrate 102.

In at least one embodiment, the trench over which the laser active stripe 250 is arranged may be formed by first and second contacts of the submount with increased thicknesses.

Figure 5:
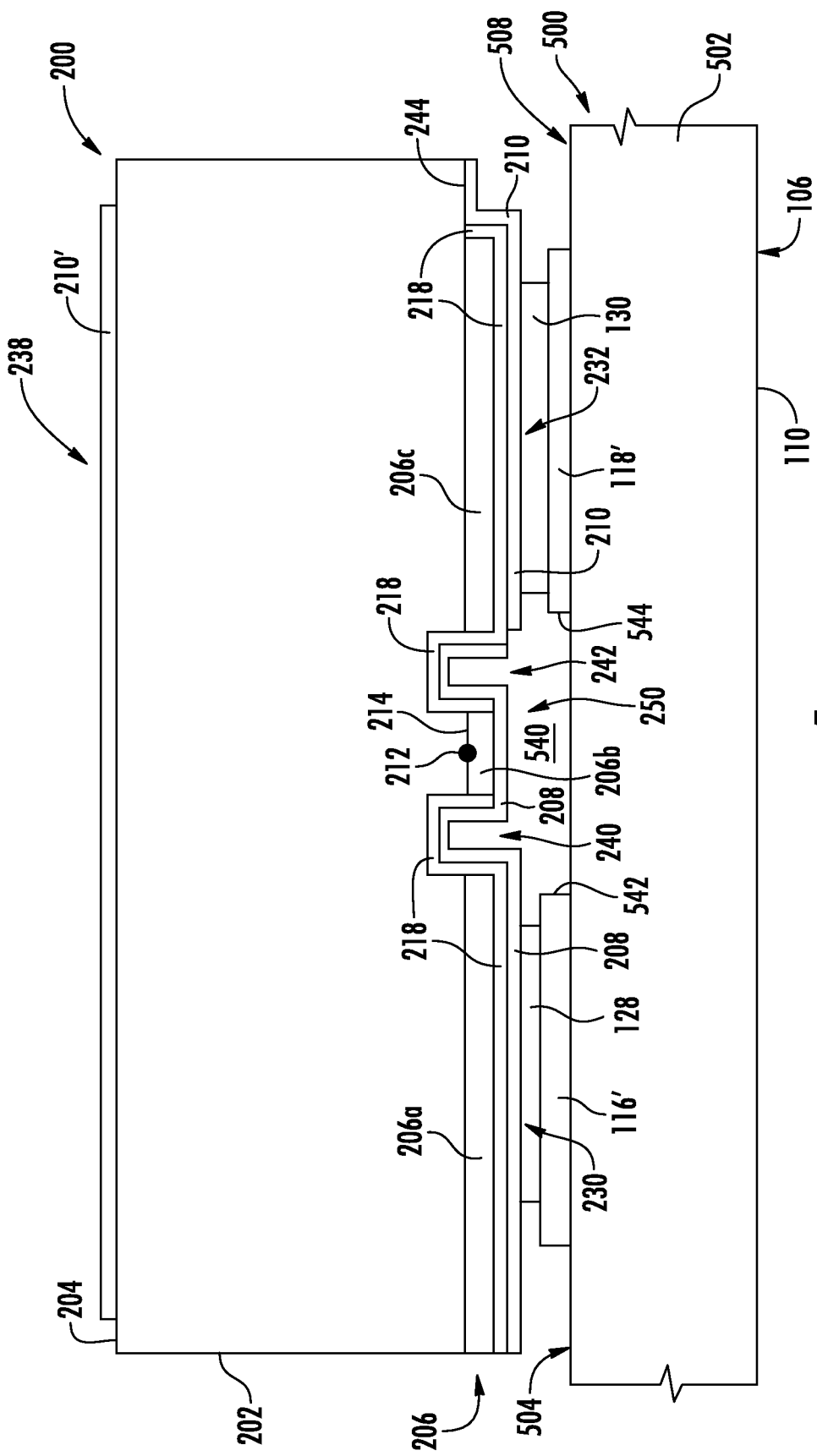
FIG. 5 is a side cross-sectional view of the semiconductor laser of FIGS. 2A and 2B bonded to a submount according to yet another embodiment.

Referring to FIG. 5, the first electrical contact 116' and the second electrical contact 118' have increased thicknesses, relative to the first electrical contact 116 and the second electrical contact 118 illustrated in FIGS. 3C and 4, such that the first electrical contact 116' and the second electrical contact 118' protrude above a surface 508 of the first side 504 of a substrate 500. The trench 540 between the first electrical contact 116' and the second electrical contact 118' is defined by sidewalls 542 and 544 of the respective first electrical contact 116' and the second electrical contact 118' and by the surface 508 of the substrate 500. As shown in FIG. 5, the first electrical contact 116' and the second electrical contact 118' have sufficient thickness such that the bonded semiconductor laser 200 and submount 500 include a gap between the laser active stripe 250 and the surface 508 of the first side 504 of the substrate 502. To further control the solder during bonding, a thin, electrically-insulating layer can be added on the side walls 542 and 544 and on the surface 508 to prevent solder from flowing into the trench 540.

Figure 6A:
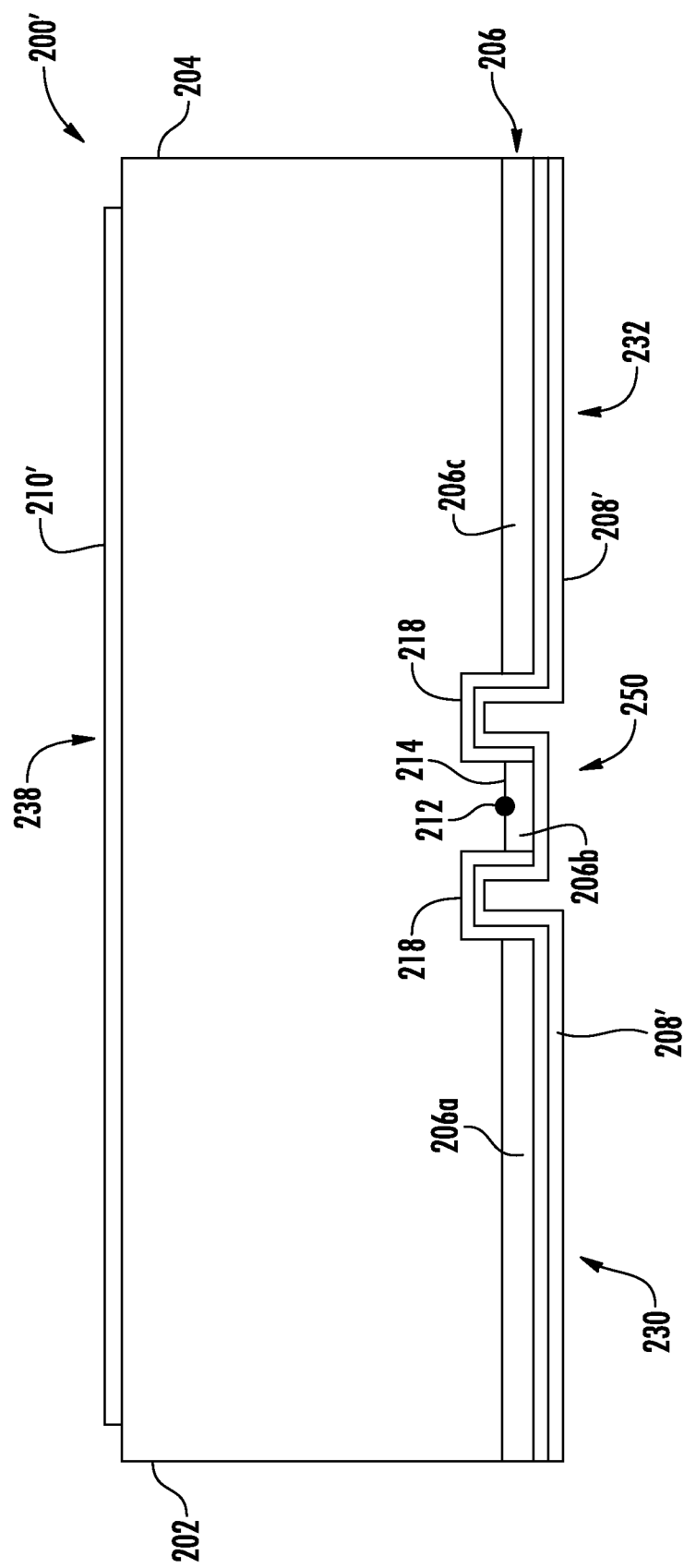
FIG. 6A is a side cross-sectional view of a semiconductor laser according to another embodiment.

In at least one embodiment, the above-described submounts may be used with a semiconductor laser that includes one electrical contact on one side of the semiconductor laser and another electrical contact on an opposing second side of the semiconductor laser. FIG. 6A is a cross-sectional side view of a semiconductor laser 200' that includes the third and fourth electrical contact 208' on one side of the semiconductor laser 200' (wherein the first electrical contact 116 and the second electrical contact 118 are arranged on the submount) and a fifth electrical contact 210' on an opposing second side of the semiconductor laser 200'. In the embodiment shown in FIG. 6A, the third and fourth electrical contact 208' are electrically connected to the p-doped region 206b of the semiconductor laser 200'. As with the semiconductor laser 200 discussed above with reference to FIGS. 2B, 3, 4, and 5, outward-facing surfaces 230 and 232 of the first p-doped region 206a and the third p-doped region 206c are covered with an insulating layer 218 such that the first p-doped region 206a and the third p-doped region 206c are not electrically connected to the third and fourth electrical contact 208'.

The fifth electrical contact 210' is arranged on an outward-facing surface 238 of the n-doped side 204 of the semiconductor laser 200', wherein the outward-facing surface 238 is on an opposing side of the semiconductor laser 200' from the outward-facing surfaces 230 and 232. The fifth electrical contact 210' is electrically connected to the n-doped side 204 of the semiconductor laser 200.

Figure 6B:
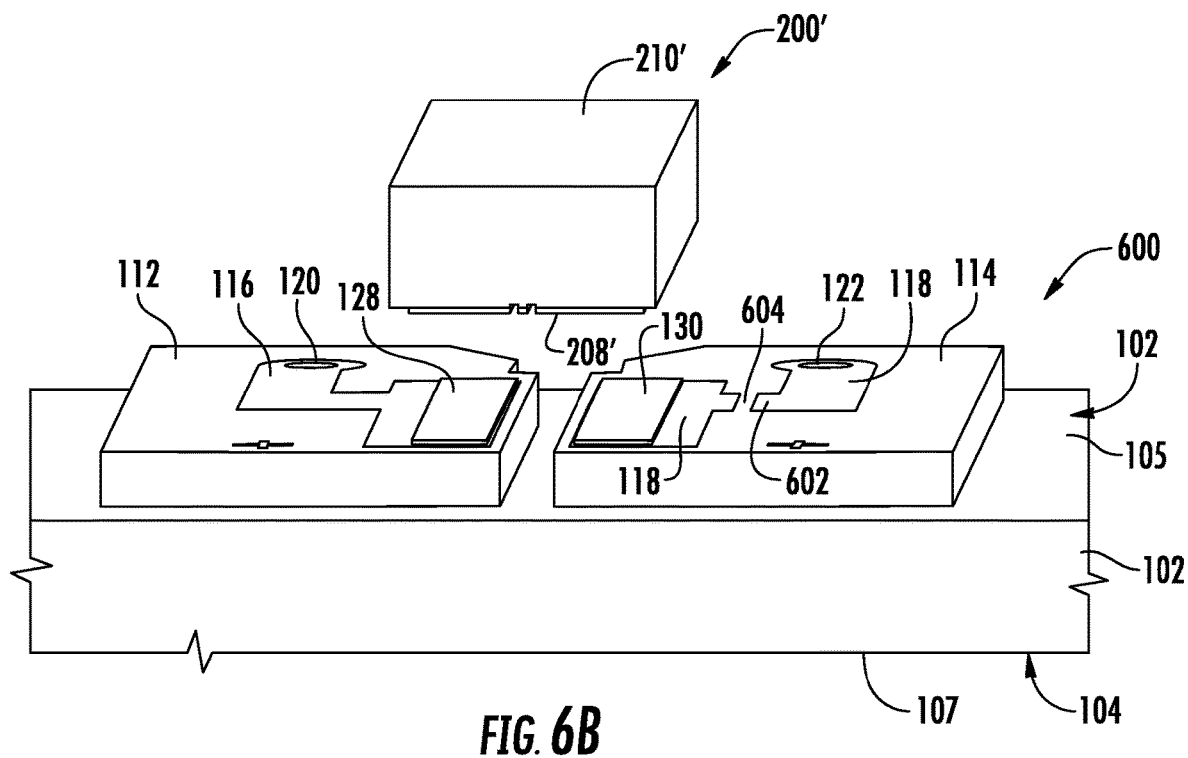
FIG. 6B is an exploded perspective view of the semiconductor laser of FIG. 6A aligned with electrical contacts of the submount of FIG. 1D, wherein the submount is modified to include an additional electrical contact.
Figure 6C:
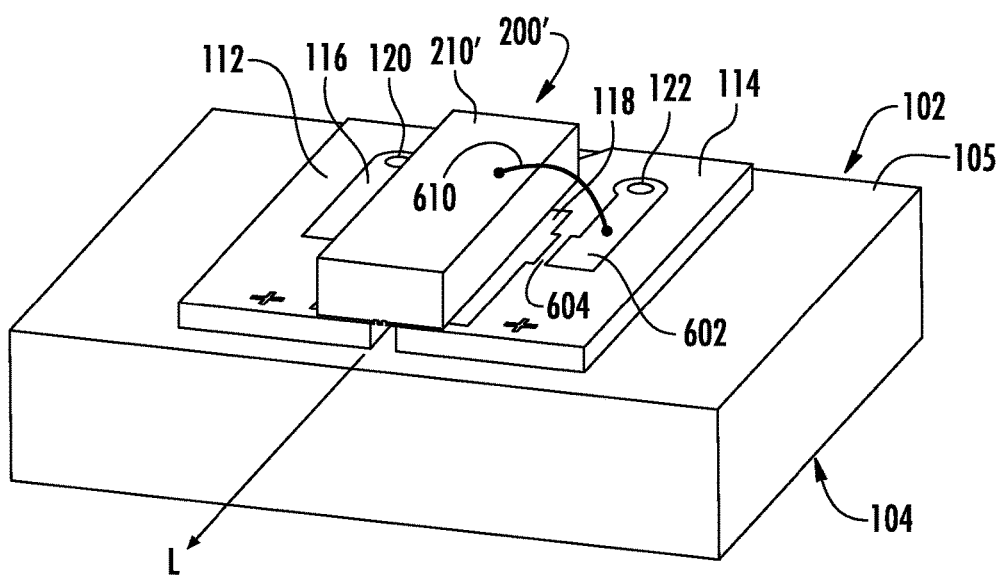
FIG. 6C is a perspective view of the semiconductor laser of FIG. 6A bonded to electrical contacts of the submount of FIG. 1D, wherein the additional electrical contact is connected to the semiconductor laser via a wire.

FIGS. 6B and 6C illustrate the semiconductor laser 200' aligned with and bonded to a submount 600, respectively. In this embodiment, the first and second electrical contacts 116 and 118 of the submount 600 are both bonded to the third and fourth electrical contacts 208' of the semiconductor laser 200'. However, the second electrical contact 118 is electrically isolated from the TSV 122 by a gap 604. As a result, the third and fourth electrical contacts 208' of the semiconductor laser 200' only receive electrical current from the first electrical contact 116. The gap 604 forms a sixth electrical contact 602 that is electrically connected to the TSV 122. The fifth electrical contact 210' of the semiconductor laser 200' is electrically connected to the sixth electrical contact 602 via a wire 610 or other conductive structure. In operation, a voltage difference is generated between the first and second electrical contacts 116 and 118 of the submount 600 and the sixth electrical contact 602. The voltage difference may be a constant voltage or a pulsed voltage. The voltage difference is transmitted to the third and fourth electrical contacts 208' and to the fifth electrical contact 210' of the semiconductor laser 200' to generate a voltage across the p-n junction 214 to activate the laser 212.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

The embodiments described herein are advantageous because they enable a laser active stripe to be arranged in a facing relationship with a submount without applying thermal or mechanical stresses to the laser active stripe via solder contacting the laser active stripe. Such a configuration enables improved dimensional tolerances for the laser active stripe relative to the submount.

We claim:

1. A laser light source, the laser light source comprising:
a submount comprising:
a substrate that includes:
a first side comprising:
a first surface located in a first plane;
a first raised surface located in a second plane parallel to the first plane; and
a second raised surface, located in the second plane and separated from the first raised surface by a trench;
a second side opposing the first side;
a first electrical contact, arranged on the first raised surface and protruding above the first raised surface to a third plane parallel to the second plane; and
a second electrical contact arranged on the second raised surface protruding above the second raised surface to the third plane; and
a semiconductor laser comprising:
a first doped side;
a second doped side, oppositely doped from the first doped side;
a third electrical contact directly connected to the first doped side and bonded to the first electrical contact;
a fourth electrical contact directly connected to the second doped side and bonded to the second electrical contact;
a laser active stripe arranged between the third electrical contact and fourth electrical contact, wherein the laser active stripe is arranged directly over the trench and not over the fourth electrical contact.

2. The laser light source of claim 1, wherein a voltage difference between the first electrical contact and the second electrical contact is configured to be one of a constant voltage or a pulsed voltage.

3. The laser light source of claim 1, wherein the fourth electrical contact is connected to the first doped side, wherein the semiconductor laser further comprises a fifth electrical contact connected to the second doped side of the semiconductor laser, wherein the submount further comprises a sixth electrical contact, wherein the sixth electrical contact is electrically connected to the fifth electrical contact, and wherein the semiconductor laser is configured to generate a laser beam in a p-n junction based on a voltage difference between the first and second electrical contacts and the sixth electrical contact.

4. The laser light source of claim 3, wherein the voltage difference between the first and second electrical contacts and the fifth electrical contact is configured to be one of a constant voltage or a pulsed voltage.

5. The laser light source of claim 1, wherein the first electrical contact and the second electrical contact protrude above a surface of the first side of the substrate, and wherein the trench is defined by sidewalls of the first and second electrical contacts and a surface of the substrate therebetween.

6. The laser light source of claim 1, wherein the trench is an etched feature in a surface on the first side of the substrate between the first electrical contact and the second electrical contact.

7. The laser light source of claim 6, wherein the trench defines a rectangle-shaped cross-sectional profile.

8. The laser light source of claim 6, wherein the trench defines a triangle-shaped cross-sectional profile.

9. The laser light source of claim 1, further comprising a cavity on the first side of the substrate configured to receive an optical component that modifies laser light from the laser active stripe of the semiconductor laser.

10. The laser light source of claim 9, further comprising a lens arranged in the cavity on the first side of the substrate.

11. The laser light source of claim 1, wherein the substrate includes a first power contact and a second power contact arranged on the second side, wherein the submount includes a first through electrical via from the first side to the second side and electrically connecting the first electrical contact and the first power contact, and wherein the submount includes a second through electrical via from the first side to the second side and electrically connecting the second electrical contact and the second power contact.

12. A method, comprising:
providing a submount, the submount comprising:
    a substrate that includes a first side and an opposing second side; and
    a first electrical contact and a second electrical contact arranged on the first side, wherein the first electrical contact and the second electrical contact are separated by a trench;
providing a semiconductor laser, wherein the semiconductor laser comprises:
    a third electrical contact that is directly connected to a first doped side of the semiconductor laser;
    a fourth electrical contact that is directly connected to a second doped side of the semiconductor laser, oppositely doped from the first doped side; and
    a laser active stripe arranged between the third electrical contact and the fourth electrical contact, and not over the fourth electrical contact;
arranging the semiconductor laser over the first side of the substrate of the submount such that the first electrical contact is aligned with the third electrical contact, the second electrical contact is aligned with the fourth electrical contact, and the laser active stripe is arranged directly above the trench;
bonding the third electrical contact to the first electrical contact; and
bonding the fourth electrical contact to the second electrical contact with one of solder or conductive epoxy pre-deposited on the second electrical contact.

13. The method of claim 12, wherein bonding the third electrical contact to the first electrical contact and the fourth electrical contact to the second electrical contact comprises bonding with one of solder or conductive epoxy arranged on the first electrical contact and the second electrical contact before the semiconductor laser is arranged over the first side of the substrate of the submount.

* * * * *